(12) United States Patent
Olgaard et al.

(10) Patent No.: US 9,160,554 B1
(45) Date of Patent: Oct. 13, 2015

(54) APPARATUS AND METHOD FOR OPERATING AUTOMATED TEST EQUIPMENT (ATE)

(75) Inventors: Christian Volf Olgaard, Sunnyvale, CA (US); Thomas Toldborg Andersen, Pleasanton, CA (US); Carsten Andersen, Sunnyvale, CA (US)

(73) Assignee: LITEPOINT CORPORATION, Sunnyvale, CA (US)

( * ) Notice: Subject to any disclaimer, the term of this patent is extended or adjusted under 35 U.S.C. 154(b) by 634 days.

(21) Appl. No.: 11/931,566

(22) Filed: Oct. 31, 2007

Related U.S. Application Data

(63) Continuation of application No. 11/004,723, filed on Dec. 3, 2004, now Pat. No. 7,363,188.

(51) Int. Cl.
*G01R 31/14* (2006.01)
*H04L 12/26* (2006.01)
*G01R 31/3183* (2006.01)

(52) U.S. Cl.
CPC .... *H04L 12/2697* (2013.01); *G01R 31/318307* (2013.01)

(58) Field of Classification Search
CPC .............. H04L 12/2697; G01R 31/318307
USPC ............. 702/118–122, 123, 188; 455/423, 455/432.1, 67.11
See application file for complete search history.

(56) References Cited

U.S. PATENT DOCUMENTS

| | | | |
|---|---|---|---|
| 4,833,676 A | 5/1989 | Koo | |
| 4,897,842 A | 1/1990 | Herz | |
| 5,138,608 A | 8/1992 | Kucera et al. | |
| 5,910,977 A | 6/1999 | Torresgrossa | |
| 5,970,430 A * | 10/1999 | Burns et al. | 702/122 |
| 5,977,913 A * | 11/1999 | Christ | 342/465 |
| 6,542,740 B1 * | 4/2003 | Olgaard et al. | 455/432.1 |
| 6,687,834 B1 * | 2/2004 | Morales et al. | 717/127 |
| 6,753,693 B2 | 6/2004 | Seo et al. | |
| 6,772,099 B2 | 8/2004 | Merkin et al. | |
| 6,870,392 B2 | 3/2005 | Kilian et al. | |
| 6,986,086 B2 * | 1/2006 | Scholten | 714/724 |
| 7,057,518 B2 | 6/2006 | Schmidt | |
| 7,463,140 B2 | 12/2008 | Schmidt | |
| 7,539,489 B1 * | 5/2009 | Alexander | 455/423 |
| 7,564,893 B2 | 7/2009 | O'Neill | |
| 7,890,822 B2 | 2/2011 | Behziz et al. | |

* cited by examiner

*Primary Examiner* — Eliseo Ramos Feliciano
*Assistant Examiner* — Eman Alkafawi
(74) *Attorney, Agent, or Firm* — Vedder Price, P.C.

(57) ABSTRACT

An apparatus and method of operating automated test equipment (ATE) in a networked environment of multiple external test controllers. The system resources responsible for coordinating the shared uses of the ATE by the multiple external test controllers are centralized within the ATE. As a result, programming of the respective test controllers is simplified since the test controllers no longer need be responsible for communicating among themselves to coordinate or otherwise determine how and when access to the ATE is granted to any particular test controller.

18 Claims, 3 Drawing Sheets

APPARATUS AND METHOD FOR OPERATING AUTOMATED TEST EQUIPMENT (ATE)

RELATED APPLICATION

This application is a continuation of U.S. patent application Ser. No. 11/004,723, filed on Dec. 3, 2004.

BACKGROUND OF THE INVENTION

1. Field of the Invention

The present invention relates to automated test equipment (ATE), and in particular, to operation of ATE in a networked environment of multiple test controllers.

2. Description of the Related Art

It is a common to use tester resource sharing when implementing manufacturing tests to insure maximum utilization of the tester (i.e., ATE). This is traditionally done by some sort of handshaking or message passing, where one test controller (e.g., a computer, or "PC") signals to other controllers that it is currently using the ATE, with the other controllers waiting until the first controller is done using the ATE, following which the first controller signals that it is done using the ATE. This means that the actual sharing is traditionally handled separately from the ATE, e.g., by use of shared file structures among the controllers or by sending messages between the controllers. Whereas this is a usable implementation, it requires the test software developer to implement the equipment sharing as a separate entity from the actual test software. Furthermore, significant overhead may exist, if the control program alters the ATE setup during test, in which case the ATE will either have to be initialized or reset, or the controllers will have to communicate among themselves regarding the state of the ATE setup. Usually, the first approach is the safest, e.g., in case of a failure in the test, which can lead to wrong ATE state information being passed among the controllers.

SUMMARY OF THE INVENTION

An apparatus and method of operating automated test equipment (ATE) in a networked environment of multiple external test controllers are provided. The system resources responsible for coordinating the shared uses of the ATE by the multiple external test controllers are centralized within the ATE. As a result, programming of the respective test controllers is simplified since the test controllers no longer need be responsible for communicating among themselves to coordinate or otherwise determine how and when to access to the ATE is granted to any particular test controller.

In one example, a method of operating automated test equipment (ATE) in a networked environment of a plurality of external test controllers to have said ATE perform one or more automated tests in accordance with a plurality of ATE instructions includes:

transmitting, from a first test controller, a first function call requesting control access to the ATE;

assigning, by the ATE in response to the first function call, the ATE control access to the first test controller when the ATE control access is available;

transmitting, from the first test controller, a plurality of ATE instructions following the assignment of the ATE control access to the first test controller; and transmitting, from the first test controller, a second function call relinquishing the ATE control access.

In one example, automated test equipment (ATE) for operation in a networked environment of a plurality of external test controllers to have said ATE perform one or more automated tests in accordance with a plurality of ATE instructions includes control request reception means, access assignment means and instruction reception means. The control request reception means is for receiving, from a first test controller, a first function call requesting control access to the ATE and second function call relinquishing the ATE control access. The access assignment means is for assigning, by the ATE in response to the first function call, the ATE control access to the first test controller when the ATE control access is available. The instruction reception means is for receiving, from the first test controller, a plurality of ATE instructions following the assignment of the ATE control access to the first test controller.

In one example, a computer readable medium of instructions for operating automated test equipment in a networked environment of a plurality of external test controllers to have said ATE perform one or more automated tests in accordance with a plurality of ATE instructions. A first set of instructions is for transmitting, from a first test controller, a first function call requesting control access to the ATE. A second set of instructions is for accepting, from the ATE in response to the first function call, assignment of the ATE control access to the first test controller when the ATE control access is available. A third set of instructions is for transmitting, from the first test controller, a plurality of ATE instructions following the assignment of the ATE control access to the first test controller. A fourth set of instructions is for transmitting, from the first test controller, a second function call relinquishing the ATE control access.

In one example, an apparatus includes automated test equipment and a test controller. The automated test equipment tests a plurality of devices under test. The test controller, which is associated with at least one of the plurality of devices under test, requests control access to the automated test equipment. The test controller controls the automated test equipment to perform the test in response to the automated test equipment granting the request. The test controller relinquishes control of the automated test equipment upon completion of the test.

In one example, an apparatus includes a test controller and automated test equipment. The test controller, which is associated with at least one of a plurality of devices under test, controls testing of the at least one of the plurality of devices under test. The automated test equipment tests the at least one of the plurality of devices under test. The automated test equipment selectively grants control access to the test controller in response to receiving a control access request from the test controller. The automated test equipment is operative to relinquish control from the test controller in response to receiving a relinquish control request from the test controller.

DETAILED DESCRIPTION

Figure 1:
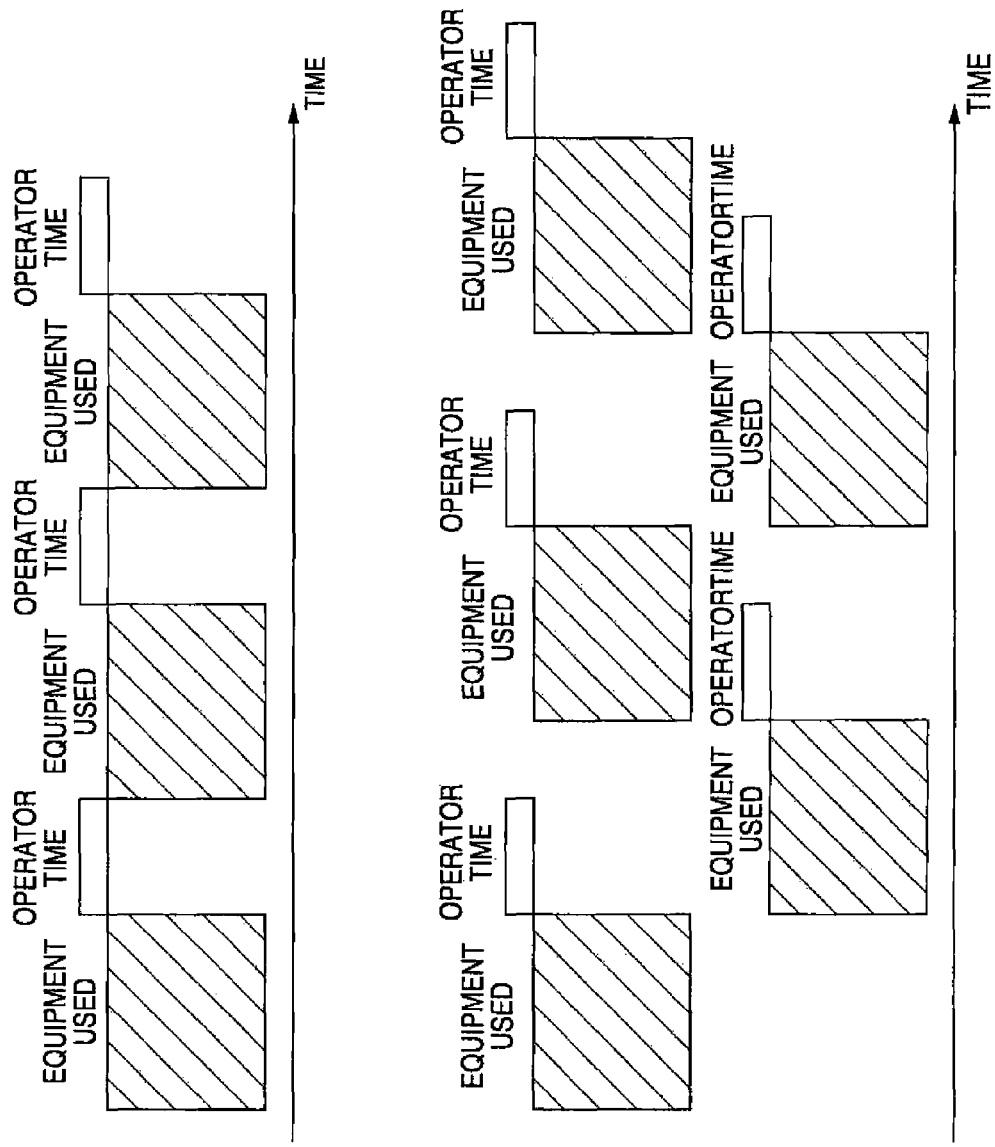
FIG. 1 is a timeline depicting increased testing throughput when operating ATE in accordance with the presently claimed invention.

Referring to FIG. 1, benefits in throughput improvement in a production test setup by sharing ATE between two or more controllers is illustrated graphically, where the upper timeline depicts the "serial" nature of the conventional technique in which ATE use and operator interaction are sequential, and the lower timeline depicts the "parallel" nature of a technique in accordance with one embodiment of the presently claimed invention in which ATE use and operator interaction overlap. By operating the ATE via a different controller while the operator interacts with the device under test (DUT), significant throughput improvements can be achieved, particularly when the test time (for the ATE) is comparable to the DUT interaction time required by the operator.

Modern ATE often relies upon a computer inside to implement the control functions. Because of this, it is possible to integrate significantly more functionality inside the ATE. One option is to integrate the signaling portion of a shared test setup directly inside the ATE. Rather than handling the signaling separate from the ATE, one can use storage inside the ATE to handle tokens passed between the controllers to gain access to the ATE. Not only will this ease the implementation for the developer of the software (in the controllers), as the handling of sharing is an integral part of the ATE, it also offers additional error checking since information about the shared status, as well as other state information, of the ATE is available directly from the ATE. Furthermore, the system can request the state of the ATE directly from the equipment itself as soon as it has taken over control, thereby synchronizing what needs to be changed. This functionality can easily be included in a function call to the ATE.

For purposes of simplifying the tests, it will be possible to use similar test programs on all test controllers as long as two or more controllers do not try to access the ATE at the same time. This will allow development of a single controller-based test setup initially, following which a more complex test setup can be established in which multiple controllers share the ATE. Accordingly, rather than having the test controllers communicate directly, it is proposed that they communicate directly with the ATE for gaining access to the ATE. By doing so, no additional software drivers are needed to control communications between the controllers. Furthermore, it ensures that communications between the test controllers and the ATE are unique and in real time.

Figure 2:
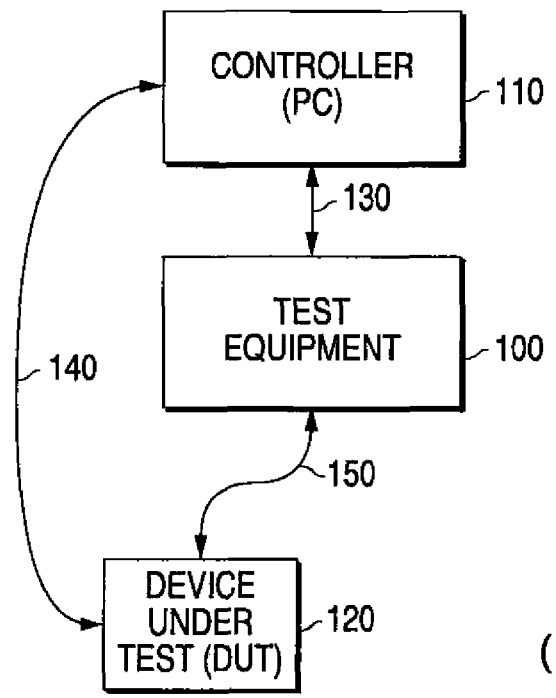
FIG. 2 is a functional block diagram of a conventional ATE setup in which the ATE has a single dedicated test controller.
Figure 3:
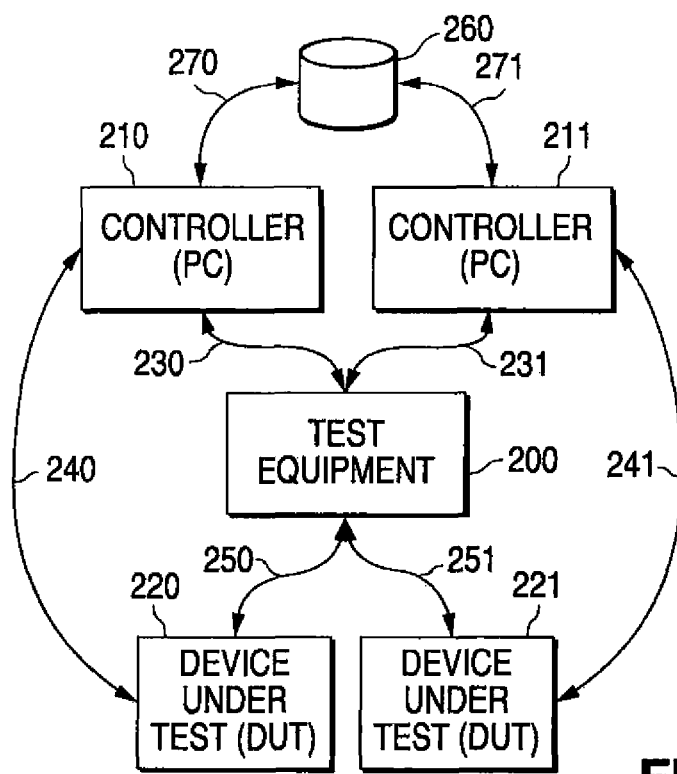
FIG. 3 is a functional block diagram of a conventional ATE setup in which the ATE is shared by multiple test controllers.

Referring to FIGS. 2 and 3, if the code for a test controller is developed with shared implementation in mind, the code will have minimal overhead when operated in a standalone operation mode (FIG. 2) or in a shared operation mode (FIG. 3) where the ATE is shared between multiple test controllers 210, 211 using a conventional file-based sharing system 260. If an existing test control program already exists, one can simply add a function call at the start of the main test loop to wait for the ATE to be available for use, and another function call at the completion of the test loop to release the ATE, thereby allowing the other controller(s) to be alerted (e.g., either immediately or in response to inquiries) that the ATE is no longer being used by the first controller.

Modern ATE allows control by external test controllers, e.g., computers, through a predefined command set. The command set can be issued over a control interface such as a General Purpose Interface Bus (GPIB) or Universal Serial Bus (USB), and increasingly through a TCP/IP interface over Ethernet, e.g., via an interface using dynamic link library (DLL) files. Typically, these commands relate to direct control of the ATE, e.g., setting frequency, measuring voltage and current, or downloading other data. What is proposed is to extend this command set beyond merely direct control of the ATE to include commands to handle sharing of the ATE. In a simple implementation, it will include two commands: one to request control of the ATE, and another to check if the ATE is in use by another controller. A further extended set of commands can be envisioned to handle a queue in which the ATE serves the controllers in the order in which it is requested to do so by granting access in this same order as requested.

In one exemplary implementation, a data storage element (e.g., a register) can be used to handle the access to the tester. Alternatively, this can be extended to more advanced techniques in which more information is stored in the ATE, e.g., if the control protocol is TCP/IP based one could store the MAC address(es) or IP address(es) of the test controller(s) allowed to access the ATE while blocking other controllers from obtaining access to the ATE. By embedding the actual implementation in commands, developers of test programs need not know about the underlying implementation, but need only use the few functions available to request access to the ATE, use the ATE, and release control of or otherwise signal that the ATE is no longer needed.

Referring again to FIG. 2, in a conventional ATE setup without implementing resource sharing the ATE 100 is connected to the controller 110 via a control cable 130. This cable 130 can be any control interface, e.g., GPIB, USB, TCP/IP etc. The ATE 100 is also connected to a device under test (DUT) 120 through a test connection 150. This cable 150 will be of the relevant type for performing the needed tests (e.g., co-axial cabling for radio frequency signals, multiple conductor cabling for digital data transfers, etc.). Additionally, an optional control cable 140 can be used between the controller 110 and the DUT 120 to allow the controller 110 to control the DUT 120 more directly. In some cases, the controller 110 may include multiple controllers communicating together, e.g., through socket communication(s).

Referring again to FIG. 3, in a conventional ATE setup in which test equipment sharing is implemented the ATE 200 is connected to two controllers 210, 211 using respective control cables 230, 231. The ATE 200 is connected to two DUTs 220, 221 via respective test cables 250, 251, and the controllers 210, 211 can use optional cables 240, 241 to control the DUTs 220, 221 such that controller 210 controls DUT 220 using control cable 240, and controller 211 controls DUT 221 using control cable 241. As discussed above, a method is needed for the two controllers 210, 211 to communicate with each other. This is illustrated as communication to a third device 260 via control cables 270, 271. A typical implementation can be using file sharing where the two controllers 210, 211 communicate with each other via shared data or program files. Another option would be to use socket communication, which is well known in the art. Such other communication device 260 can be integrated into one of the two controllers 210, 211 as a shared file directory, etc.

Figure 4:
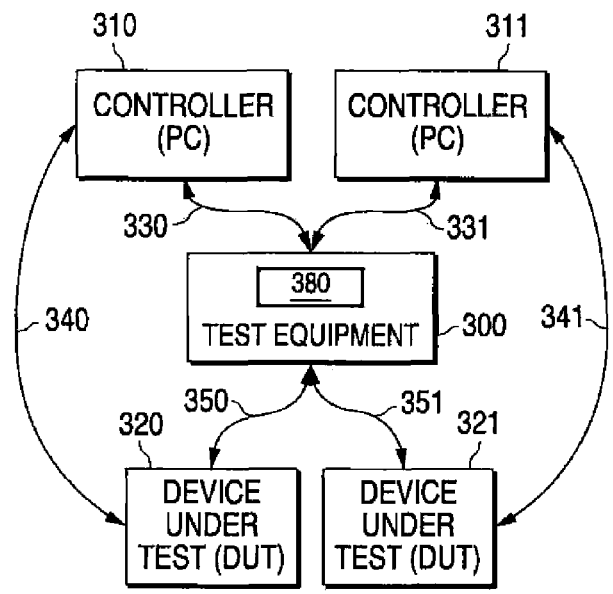
FIG. 4 is a functional block diagram of an ATE setup in which the ATE is shared by multiple test controllers in accordance with one embodiment of the presently claimed invention.

Referring to FIG. 4, an implementation of ATE resource sharing in accordance with one embodiment of the presently claimed invention includes ATE 300 connected to two controllers 310, 311 via respective control cables 330, 331. The ATE 300 is also connected to two DUTs 320, 321 via respective test cables 350, 351. The controllers 310, 311 are also connected to the DUTs 320, 321 via respective optional control cables 340, 341. A resource 380 is included within or otherwise associated with the ATE 300, thereby allowing each controller 310, 311 to determine if and when the ATE 300 is being accessed or otherwise used by the other controller, or if the ATE 300 is otherwise available for use and control by the requesting controller. Examples of such a resource. 380 include a register where a token is stored, and program subroutines which, when called, identify and communicate the access status of the ATE 300. Other examples of resources for communicating the message of if or when the ATE is available will be readily apparent to one of ordinary skill in the art.

Referring to FIGS. 3 and 4, these examples depict two controllers and two DUTs. However, one skilled in the art will readily realize that this can be extrapolated to more than two DUTs with corresponding multiple controllers. Similarly, one could use a single controller to control multiple DUTs by multi-tasking. With only one controller, the resource switching can be implemented directly in the program without the need for the described methodology. However, in many test systems, it may be that one controller cannot reliably control two or more DUTs independently, so multiple controllers may be needed, e.g., when testing wireless PC cards (as the DUTs) where the controller is usually a PC, such PC likely cannot control two identical cards simultaneously, and such a test system could "freeze" while the operator is changing a DUT. As a result, it may not be efficient to attempt testing a second DUT while changing the first DUT.

Figure 5:
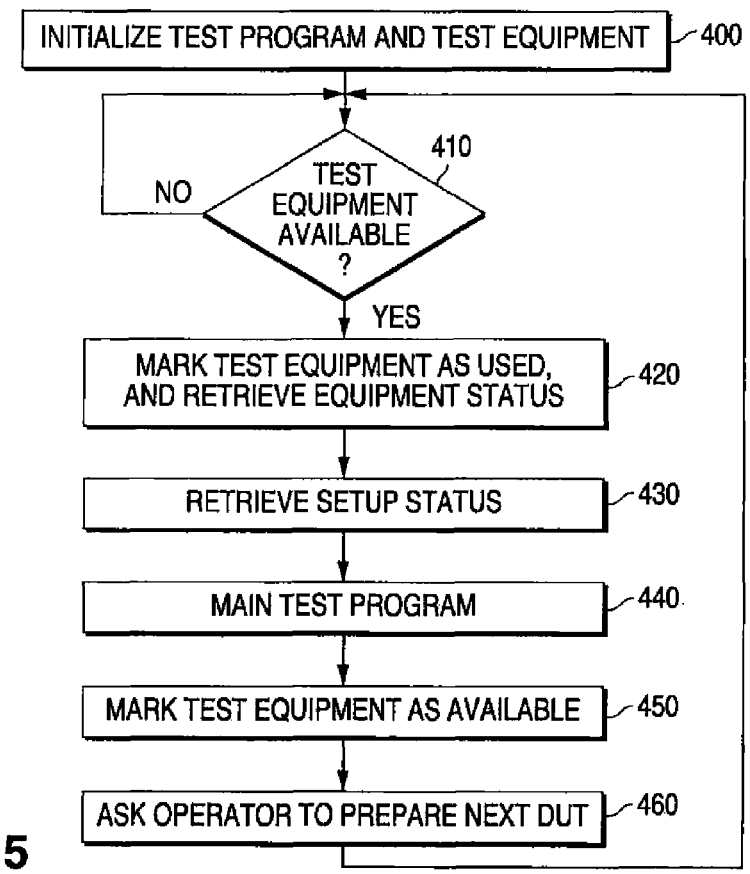
FIG. 5 is a flowchart depicting a method of operating ATE in accordance with another embodiment of the presently claimed invention.

Referring to FIG. 5, a typical test flow is illustrated for a program implementing ATE resource sharing in accordance with another embodiment of the presently claimed invention. (As should be immediately recognized by one of ordinary skill in the art, such program would likely be implemented as a set of instructions stored on a computer readable medium, e.g., internal memory such as a hard disk drive, RAM or ROM, within or otherwise associated with the test controller being controlled by such program.) The program is initialized 400, followed by a test 410 to see if the ATE is being used. In a preferred implementation, a function call to the ATE will be implemented to ask if the ATE is being used. The program remains at this point until the ATE becomes available. When becoming available, the program will tell the other controllers that the ATE is now in use 420. One implementation is to send a command to the ATE and get a reply back that access has been granted. In another implementation, the ATE assigns one or more internal status signals (e.g., one or more bits in a status register) indicative of its availability to the requesting controller, and begins responding to commands received from the requesting controller without expressly communicating back to the requesting controller that access has been granted. The granting of access will become evident when the requesting controller begins receiving data from the ATE in response to commands from the requesting controller. The program retrieves the setup status of the ATE 430 so it needs only to program the required changes rather than program a complete ATE setup. This is an optional step, and can be omitted if the main program resets the ATE at the start of the program. Following this resetting or initialization of the ATE, the main test program 440 is then executed. Once the last test using the ATE is completed the program 450 informs the other controllers that the ATE is now available. This is preferably implemented by a function call to the ATE indicating that access to or control of the ATE is no longer needed by that particular controller. Following this, the operator may be requested to replace the DUT 460, following which the program can return to again request access to the test equipment 410.

While the ability to retrieve the current setup 430 of the ATE is not a required operation, it is useful since it allows the system to implement an incremental setup where only the affected portions of the ATE setup need be updated or changed. This can save significant time as compared to a complete resetting or re-initializing of the ATE.

Referring again to FIG. 5, in the case where only a single test controller is used and it has sole access to the ATE, the flow is identical to what was just described above. When the program requested to use the test equipment 410, access is granted immediately (since no other controllers requests are involved). The program then signals it is using the ATE 420, restores the ATE setup 430, executes the test program 440, signals it is no longer requires access to the ATE 450, and requests the operator to prepare the next DUT 460, following which it returns to request access to the test equipment 410. As the ATE is ready, the program can resume immediately.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. A method of operating automated test equipment (ATE) in a networked environment of a plurality of external test controllers to have said ATE perform one or more automated tests in response to a plurality of ATE instructions, comprising:

transmitting, from a first test controller separate from and external to said ATE, a first function call requesting control access to said ATE for testing a device under test (DUT) separate from and external to said first test controller and said ATE;

communicating, between said first test controller and said DUT, one or more control signals;

waiting, by said first test controller, for said ATE control access to be available;

assigning, by said ATE in response to said first function call, said ATE control access to said first test controller when said ATE control access is available;

providing an indication, to said plurality of external test controllers, that said ATE control access is unavailable;

transmitting, from said first test controller, said plurality of ATE instructions following said assignment of said ATE control access to said first test controller;

communicating, between said ATE and said DUT, one or more test signals related to said plurality of ATE instructions;

transmitting, from said first test controller to said ATE, a second function call relinquishing said ATE control access following completion of said transmission of said plurality of ATE instructions;

providing an indication, to said plurality of external test controllers, that said ATE control access is available; and maintaining, until transmission from said first test controller of said second function call, said assignment by said ATE of said ATE control access to said first test controller.

2. The method of claim 1, wherein said assigning, by said ATE in response to said first function call, said ATE control access to said first test controller when said ATE control access is available comprises transmitting, from said ATE, an ATE access status reply.

3. The method of claim 1, wherein said assigning, by said ATE in response to said first function call, said ATE control access to said first test controller when said ATE control access is available comprises:
 assigning a first plurality of bit states to a plurality of access status bits within said ATE when said ATE control access is assigned to said first test controller; and
 maintaining said plurality of access status bits in a second plurality of bit states when said ATE control access is not available to said first test controller.

4. The method of claim 1, further comprising transmitting, from said first test controller, an ATE setup status request following said assignment by said ATE of said ATE control access.

5. The method of claim 1, wherein said transmitting, from said first test controller, a plurality of ATE instructions following said assignment by said ATE of said ATE control access comprises:
 transmitting an ATE setup status request; and
 transmitting a plurality of ATE control instructions.

6. The method of claim 5, wherein said transmitting a plurality of ATE control instructions comprises:
 transmitting one or more ATE setup instructions; and
 transmitting one or more test control instructions.

7. An apparatus including automated test equipment (ATE) for operation in a networked environment of a plurality of external test controllers to have said ATE perform one or more automated tests in response to a plurality of ATE instructions, comprising:
 control request reception means for receiving, from a first test controller separate from and external to said ATE,
  a first function call requesting control access to said ATE for testing a device under test (DUT) separate from and external to said first test controller and said ATE, and
  a second function call relinquishing said ATE control access following reception of said plurality of ATE instructions;
 access assignment means for assigning, by said ATE in response to said first function call, said ATE control access to said first test controller when said ATE control access is available and maintaining, until reception of said second function call from said first test controller, said assignment by said ATE of said ATE control access to said first test controller;
 access indication means for providing an indication to said plurality of external test controllers that
  said ATE control access is unavailable following reception of said first function call, and
  said ATE control access is available following reception of said second function call; and
 instruction response means for
  receiving, from said first test controller, said plurality of ATE instructions following said assignment of said ATE control access to said first test controller, and
  communicating, between said ATE and said DUT, one or more test signals related to said plurality of ATE instructions.

8. The apparatus of claim 7, wherein said control request reception means is further for receiving, from said first test controller, an ATE setup status request following said assignment by said ATE of said ATE control access.

9. A non-transitory computer readable medium of instructions for operating automated test equipment in a networked environment of a plurality of external test controllers to have said ATE perform one or more automated tests in response to a plurality of ATE instructions, comprising:
 a first set of instructions for transmitting, from a first test controller separate from and external to said ATE, a first function call requesting control access to said ATE for testing a device under test (DUT) separate from and external to said first test controller and said ATE;
 a second set of instructions for communicating, between said first test controller and said DUT, one or more control signals;
 a third set of instructions for waiting, by said first test controller, for said ATE control access to become available;
 a fourth set of instructions for accepting, from said ATE in response to said first function call, assignment of said ATE control access to said first test controller when said ATE control access is available;
 a fifth set of instructions for providing an indication to said plurality of external test controllers that said ATE control access is unavailable following said accepting assignment of said ATE control access to said first test controller;
 a sixth set of instructions for transmitting, from said first test controller, a plurality of ATE instructions following said assignment of said ATE control access to said first test controller;
 a seventh set of instructions for communicating, between said ATE and said DUT, one or more test signals related to said plurality of ATE instructions;
 an eighth set of instructions for transmitting, from said first test controller, a second function call relinquishing said ATE control access following completion of said transmission of said plurality of ATE instructions;
 a ninth set of instructions for providing an indication to said plurality of external test controllers that said ATE control access is available following said second function call; and
 a tenth set of instructions for maintaining said ATE control access until transmission of said second function call.

10. The computer readable medium of instructions of claim 9, wherein said second set of instructions comprises one or more instructions for receiving, from said ATE, an ATE access status reply.

11. The computer readable medium of instructions of claim 9, wherein said second set of instructions comprises one or more instructions for receiving, from said ATE:
 a first plurality of data representing a plurality of access status bits within said ATE when said ATE control access is assigned to said first test controller; and
 a second plurality of data representing said plurality of access status bits when said ATE control access is not available to said first test controller.

12. The computer readable medium of instructions of claim 9, further comprising an eleventh set of instructions for transmitting, from said first test controller, an ATE setup status request following said assignment by said ATE of said ATE control access.

13. The computer readable medium of instructions of claim 9, wherein said sixth set of instructions comprises:
 a first one or more instructions for transmitting an ATE setup status request; and
 a second one or more instructions for transmitting a plurality of ATE control instructions.

14. The computer readable medium of instructions of claim 13, wherein said second one or more instructions comprises:
 a third one or more instructions for transmitting one or more ATE setup instructions; and a fourth one or more instructions for transmitting one or more test control instructions.

15. An apparatus, comprising:

automated test equipment that is operative, in response to a plurality of test instructions, to test a plurality of devices under test separate from and external to said automated test equipment by communicating, between said automated test equipment and said plurality of devices under test, one or more test signals related to said plurality of test instructions; and a test controller, separate from and external to said automated test equipment and said plurality of devices under test, and associated with at least one of said plurality of devices under test, that is operative to communicate one or more control signals to said at least one of said plurality of devices under test, request control access to said automated test equipment, to wait for said control access to become available, to control said automated test equipment to perform said test by providing said plurality of test instructions in response to said automated test equipment granting said request for control access, to maintain said control access until completion of said test, and to relinquish said control access following completion of said test.

16. The apparatus of claim 15 wherein said automated test equipment is operative to grant said control access to said test controller when said automated test equipment is available to test said at least one of said plurality of devices under test.

17. An apparatus, comprising:

a test controller, associated with but separate from and external to at least one of a plurality of devices under test, that is operative to control testing of said at least one of said plurality of devices under test by communicating one or more control signals to said at least one of said plurality of devices under test and providing a plurality of test instructions; and automated test equipment, separate from and external to said test controller and said at least one of a plurality of devices under test, that is operative to test said at least one of said plurality of devices under test in response to said plurality of test instructions, wherein said automated test equipment is operative to selectively grant control access to said test controller in response to receiving a control access request from said test controller; wherein said automated test equipment is operative to provide an indication to said test controller as to whether said control access is available or unavailable; wherein said automated test equipment is operative to relinquish said control access from said test controller in response to receiving a relinquish control request from said test controller following completion of said testing; and wherein said automated test equipment is operative to maintain, until receiving said relinquish control request from said test controller, said grant of control access to said test controller.

18. The apparatus of claim 17 wherein said automated test equipment is operative to grant said control access when said automated test equipment is available to test said at least one of said plurality of devices under test.

\* \* \* \* \*